United States Patent
Scholte Von Mast et al.

(10) Patent No.: US 10,138,553 B2
(45) Date of Patent: *Nov. 27, 2018

(54) VACUUM TREATMENT APPARATUS

(71) Applicant: EVATEC AG, Trubbach (CH)

(72) Inventors: Bart Scholte Von Mast, Azmoos (CH); Wolfgang Rietzler, Bludenz (AT); Rogier Lodder, Bad Ragaz (CH); Rolf Bazlen, Rorschach (CH); Daniel Rohrer, Mels (CH)

(73) Assignee: EVATEC AG, Trubbach (CH)

( * ) Notice: Subject to any disclaimer, the term of this patent is extended or adjusted under 35 U.S.C. 154(b) by 0 days.

This patent is subject to a terminal disclaimer.

(21) Appl. No.: 15/164,262

(22) Filed: May 25, 2016

(65) Prior Publication Data

US 2016/0265109 A1    Sep. 15, 2016

Related U.S. Application Data

(63) Continuation of application No. 13/976,314, filed as application No. PCT/EP2011/074095 on Dec. 27, 2011, now Pat. No. 9,396,981.

(Continued)

(51) Int. Cl.
  *C23C 16/458* (2006.01)
  *H01L 21/67* (2006.01)
  (Continued)

(52) U.S. Cl.
  CPC .......... *C23C 16/458* (2013.01); *C23C 14/50* (2013.01); *C23C 14/541* (2013.01);
  (Continued)

(58) Field of Classification Search
  CPC ......... H01L 21/67739; H01L 21/67742; H01L 21/67733; H01L 21/67736; H01L 21/67769; H01L 21/67167
  (Continued)

(56) References Cited

U.S. PATENT DOCUMENTS 4,969,790 A    11/1990    Petz et al.
5,248,380 A     9/1993    Tanaka
(Continued)

FOREIGN PATENT DOCUMENTS

EP    1350997 A2    10/2003
WO    2010105967 A2    9/2010
WO    2010122152 A1    10/2010

OTHER PUBLICATIONS

International Search Report for corresponding PCT Application No. PCT/EP2011/074095, dated Jul. 5, 2012.
(Continued)

*Primary Examiner* — Ronald P Jarrett
(74) *Attorney, Agent, or Firm* — Notaro, Michalos & Zaccaria P.C.

(57) ABSTRACT

To reduce pumping time of a vacuum treatment chamber served by a transport arrangement in a transport chamber. The vacuum treatment chamber is split in a workpiece treatment compartment and in a pumping compartment in mutual free flow communication and arranged opposite each other with respect to a movement path of the transport arrangement serving the vacuum treatment chamber. The pumping compartment allows providing a pumping port of a flow cross-section area freely selectable independently from the geometry of the treatment compartment.

17 Claims, 5 Drawing Sheets

Related U.S. Application Data

Figure 1:
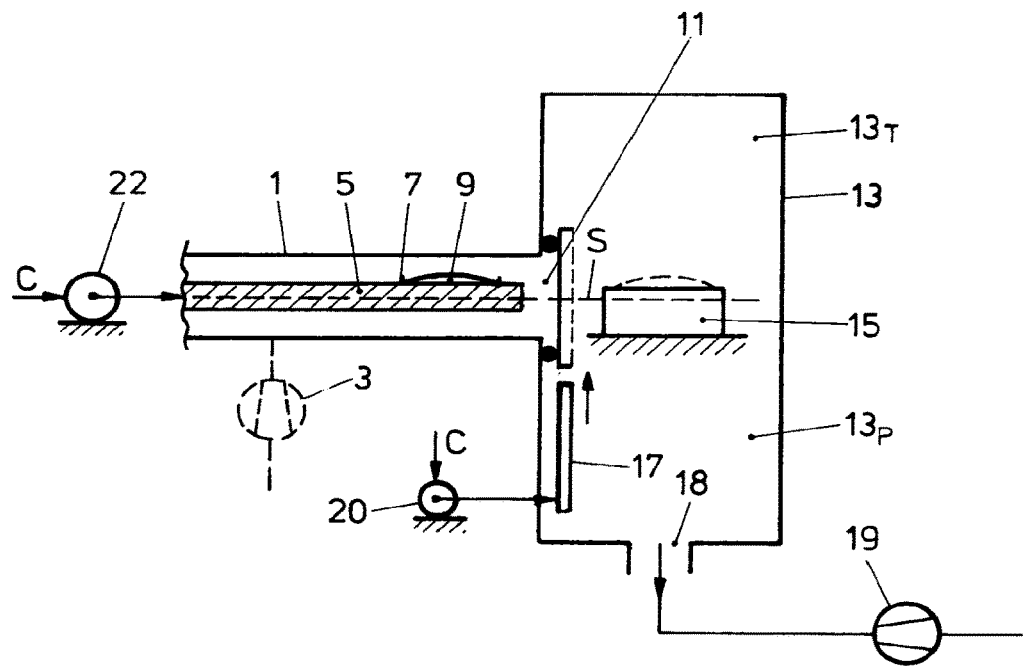

(60) Provisional application No. 61/427,861, filed on Dec. 29, 2010.

(51) Int. Cl.
*H01L 21/677* (2006.01)
*C23C 14/50* (2006.01)
*C23C 14/54* (2006.01)
*C23C 16/44* (2006.01)
*C23C 16/52* (2006.01)
*F04B 45/02* (2006.01)
*H01J 37/32* (2006.01)

(52) U.S. Cl.
CPC .......... *C23C 16/4412* (2013.01); *C23C 16/52* (2013.01); *F04B 45/02* (2013.01); *H01J 37/32724* (2013.01); *H01J 37/32834* (2013.01); *H01L 21/6719* (2013.01); *H01L 21/6776* (2013.01); *H01L 21/67703* (2013.01); *H01L 21/67739* (2013.01); *H01L 21/67748* (2013.01); *H01L 21/67751* (2013.01); *H01J 2237/3321* (2013.01)

(58) Field of Classification Search
USPC ................ 414/222.01, 222.07, 217, 219
See application file for complete search history.

(56) References Cited

U.S. PATENT DOCUMENTS

| | | |
|---|---|---|
| 5,314,574 A | 5/1994 | Takahashi |
| 6,015,503 A * | 1/2000 | Butterbaugh ......... B08B 7/0057 134/1.3 |
| 6,481,955 B2 | 11/2002 | Schertler |
| 2005/0051520 A1 | 3/2005 | Tanaka |
| 2006/0096536 A1 | 5/2006 | Tuttle |
| 2009/0060702 A1 | 3/2009 | Kobayahi et al. |
| 2010/0068895 A1 | 3/2010 | Yanai et al. |
| 2010/0136773 A1 | 6/2010 | Akae et al. |
| 2012/0027952 A1* | 2/2012 | Reising ............. H01L 21/67126 427/569 |

OTHER PUBLICATIONS

International Preliminary Examination Report and Written Opinion on corresponding PCT Application No. PCT/EP2011/074095, dated Jul. 16, 2013.

* cited by examiner

VACUUM TREATMENT APPARATUS

The present invention is generically directed on a vacuum treatment apparatus, whereat one or more than one vacuum treatment chambers are provided, which is or which are served with workpieces to be treated by a transport arrangement within a vacuum transport chamber, which latter communicates with one or more than one treatment chambers by openings, through which the workpiece is fed into or removed from the treatment. Thereby, there is specifically addressed such apparatus, at which the vacuum treatment chamber must be sealed off from the transport chamber during treatment of the one or more than one workpieces and is to be pumped down on a vacuum level necessary for the respective vacuum treatment after having been sealed off from the transport chamber. Such apparatus are e.g. known from the U.S. Pat. No. 6,481,955 or the WO 2010/105967.

It is an object of the present invention to provide such apparatus with improved pumping down times of the vacuum treatment chamber or chambers.

We understand under a "vacuum treatment" any vacuum processing of a workpiece, so e.g. any PVD or CVD vacuum process or other vacuum processes in which the workpieces are surface treated under pressures below atmospheric pressure i.e. under vacuum conditions.

The addressed object is resolved according to the present invention by a vacuum treatment apparatus which comprises a vacuum treatment chamber and a vacuum transport chamber. The vacuum transport chamber comprises a transport arrangement with at least one workpiece support and is drivingly movable along a movement path. The transport chamber communicates via an opening with the treatment chamber and is conceived to pass therethrough at least a part of the transport arrangement, the workpiece support and a workpiece therein along the movement path. The vacuum treatment chamber comprises a workpiece treatment compartment on one side of the movement path and a pumping compartment opposite the addressed workpiece treatment compartment with respect to the movement path. The pumping compartment comprises a pumping port. There is further provided a controllable sealing arrangement which controllably seals off the addressed opening between the transport chamber and the overall vacuum treatment chamber.

Thus, the overall vacuum treatment chamber is divided in a workpiece treatment compartment and in a pumping compartment which are provided opposite each other on both sides of the moving path of the transport arrangement and which are in complete flow communication. It is thereby achieved that there is in fact no limit for conceiving the extent of the pumping port as not provided in the workpiece treatment compartment. This allows installing high-capacity pumping, which is significantly determined by the flow cross-section of pumping line on the low pressure side of a pumping arrangement.

As the addressed separation of the overall vacuum treatment chamber in a workpiece treatment compartment and in a pumping compartment allows installing high pumping capacity, the possibility is opened to at least substantially evacuate also the transport chamber by a vacuum pump arrangement connected to the addressed pumping port at the pumping compartment.

By means of the controllable sealing arrangement—once the workpiece is loaded in the treatment chamber and thus ready to be treated by processing action of the treatment compartment, the transport chamber is sealed from the vacuum treatment chamber. The pumping arrangement connected to the addressed pumping port in the pumping compartment can rapidly evacuate the overall treatment chamber including the treatment compartment to that vacuum level necessitated for the intended vacuum process.

Especially in apparatus which make use of the present invention and are conceived with multiple vacuum treatment chambers served by a common transport arrangement it is highly advantageous to provide the possibility to open selected ones of the vacuum treatment chambers to ambient e.g. for maintenance purposes. Such flooding of a part of the overall apparatus to ambient should not affect the remaining vacuum areas of the apparatus. This e.g. to exchange workpieces under ambient pressure, to minimize standstill times of the overall apparatus, or even to allow further workpiece processing by the apparatus in spite of the one treatment chamber being flooded to ambient.

Under this aspect in one embodiment of the present invention the controllable sealing arrangement is conceived so as to increase sealing force as the pressure in the treatment compartment and in an area of the pumping compartment in flow communication with the pumping port increases. In other words whenever according to the present invention the transport chamber is sealed off from the treatment compartment and pressure in the pumping compartment or at least that area in the pumping compartment which is in flow communication with the pumping port and in the workpiece treatment compartment rises e.g. to ambient pressure, then the seal effect of the sealing arrangement is increased. As known to the skilled artisan, such conception may generically be fulfilled by respectively tailoring the extent of surface areas which are loaded with a respective pressure in seal-closing direction. The embodiment as just addressed may be combined with any of the subsequently addressed embodiments.

In spite of the fact that under a generic aspect the apparatus according to the present invention may be conceived so that the sealing arrangement may only establish sealing separation between the transport chamber and the treatment compartment/pumping compartment once the transport arrangement has been removed from the vacuum treatment chamber, thereby leaving the workpiece in the vacuum treatment chamber, in one embodiment of the present invention, which may be combined with any of the embodiments already addressed or addressed in the following unless in contradiction, the controllable seal arrangement is conceived to seal off the addressed opening as the transport arrangement is in a position at which the workpiece support on the transport arrangement resides within the vacuum treatment chamber. In this embodiment the transport arrangement remains within the vacuum treatment chamber during treatment of the workpiece.

In one embodiment of the present invention which may be combined with any embodiment already addressed or subsequently addressed unless in contradiction, the controllable sealing arrangement comprises a drivingly extendable and retractable tubular bellow. One end of the tubular bellow is sealingly mounted in the pumping compartment. The other end of the tubular bellow is controllably movable about the opening to seal off the opening. The pumping port is located in an area of the pumping compartment which is in flow communication with the inside of the bellow. By providing such tubular bellow it becomes possible, curtain-like, to move the movable end of the bellow sealingly across the addressed opening. Then the treatment compartment is in free flow communication through the inside of the bellow with the pumping port in the pumping compartment.

In one embodiment of the present invention making use of the addressed tubular bellow, the transport chamber extends across the vacuum treatment chamber. It thus communicates also with a second opening which is conceived to pass the transport arrangement, the workpiece support thereon and the workpiece disposed therein. The second opening is located opposite the one opening in the wall of the vacuum treatment chamber. The other end, i.e. the free end of the bellow, is sealingly movable also about the second opening. Thus, by respectively controlling the movement of the free end of the tubular bellow, both communication openings of the transport chamber to the vacuum treatment chamber may simultaneously be sealingly closed.

In one embodiment of the embodiment just addressed the transport arrangement is movable along the movement path and along the vacuum treatment chamber, through the addressed first and second openings and comprises a multitude of spaced-apart workpiece supports. In this embodiment inline treatment of a multitude of workpieces is performed in the addressed one vacuum treatment chamber.

In one embodiment of the present invention which may be combined with any embodiment as already addressed and as subsequently addressed unless in contradiction, the workpiece support on the transport arrangement comprises a through-opening. A workpiece support member is held in the through-opening and is liftable in direction towards the treatment compartment, thereby leaving its seat on the transport arrangement. The other end, i.e. the free end, of the tubular bellow is drivingly movable in a sealing contact with the addressed workpiece support member so as to lift this member into a sealing contact with an annular area along a wall of the treatment compartment. Thus, by driven movement of the free end of the tubular bellow the workpiece support member is lifted from the through-opening of the transport arrangement and is pressed sealingly towards the addressed annular area along the inner wall of the treatment compartment. Thereby, the free end of the tubular bellow as well is sealingly biased on the workpiece support member.

In one embodiment of the present invention and departing from the embodiment just addressed, the apparatus comprises a lift arrangement which is controllably liftable from the pumping compartment towards and into the treatment compartment. The lift arrangement is located inside the tubular bellow. It comprises an actuator to liftably cooperate with the open end of the tubular bellow so as to lift it into the addressed sealing contact with the workpiece support member and to lift the workpiece support member further in sealing contact with the annular area along the wall of the treatment compartment. Thus, by lifting the lift arrangement towards the treatment compartment the actuator at the lift arrangement lifts the open end of the tubular bellow up to contacting the workpiece support member, lifting latter towards and onto the annular area along the wall of the treatment compartment and establishing there a seal on one hand between the addressed annular area and the workpiece support member, and on the other hand between the workpiece support member and the upper end of the tubular bellow.

In one embodiment of the invention the addressed workpiece support member comprises a support plate with through-openings along its periphery. In this embodiment the workpiece to be treated is and stays located upon the support member and will be positioned according to that position the support member assumes when establishing the seal with the annular area along the wall of the treatment compartment. The treatment position of the workpiece and the sealing position of the workpiece support plate are not independent. The support plate has through-openings along its periphery—the workpiece resides in the center of the support plate—to establish free flow communication between the treatment compartment and the pumping port in the pumping compartment.

In a further embodiment of the invention the workpiece support member comprises a frame which may e.g. be circular or rectangular, generically adapted on the outer frame circumference to the shape of the through-opening in the transport arrangement and on the inner frame circumference to the shape of one or of a multiple of workpieces to be treated. The frame comprises holding members for the at least one workpiece within its inner open area. The holding members are conceived to allow lifting off the one or more than one workpieces from the frame in direction towards the treatment compartment. The actuator on the lift cooperates via a spring arrangement with the other end (the free end) of the tubular bellow. The lift arrangement comprises a workpiece support plate located at the end of the lift arrangement towards the treatment compartment. By this embodiment all the addressed seals of the workpiece support member, namely of the frame towards the annular area along the wall of the treatment compartment and between the open end of the tubular bellow and the addressed frame, are established but additionally and due to the spring arrangement acting between the actuator and the free end of the tubular bellow the lift arrangement may lift the workpiece on the support plate from the frame and position the workpiece within the treatment compartment at a position which is independent from establishing the addressed seals.

In one embodiment of the apparatus according to the invention, which may be combined with any of the embodiments already addressed or to be addressed unless in contradiction an additional mechanism is included to lift the workpiece from the workpiece support plate so that the position of the workpiece becomes independent from the position of the workpiece support plate. If, as an example, the workpiece support plate is equipped with heating or cooling facilities for the workpiece, then the addressed additional mechanism may be exploited to adjust heat transition to or from the workpiece even during treatment of the workpiece. Thereby an adjusting member is realized for controlling temperature of the workpiece, e.g. in a negative feedback control loop.

This embodiment thus comprises a workpiece treatment holder for said workpiece in the workpiece treatment chamber and a controllably drivable lifting arrangement for a workpiece on said workpiece treatment holder.

In a variant of this embodiment a temperature sensing means adapted to sense a temperature of the workpiece on said workpiece treatment holder is provided, whereby the temperature sensing means and the controllably drivable lifting arrangements are operatively connected in a negative feedback loop for the temperature of the workpiece.

In one embodiment of the apparatus according to the invention, which may be combined with any of the embodiments already addressed or to be addressed unless in contradiction and whereat the transport arrangement is movable along its movement path through the vacuum treatment chamber the transport arrangement is movable along a linear or along a circular moving path. The overall apparatus according to the present invention may be an apparatus, where multiple workpieces are conveyed by a linear transport arrangement in an indexed manner from one vacuum treatment facility to the next, at least one thereof being conceived according to the present invention, or the overall apparatus may be conceived with a transport arrangement which is driven about a center in a circular manner and multiple workpieces are thereby conveyed from one vacuum treatment facility to the next again in an indexed manner.

In one embodiment, which may be combined with any of the embodiments already addressed or to be addressed unless in contradiction and whereat the transport arrangement is movable along a circular moving path, the treatment compartment and the pumping compartment are arranged opposite each other in direction of an axis of the circular moving path.

In one embodiment of the present invention, which may be combined with any of the addressed embodiments, the apparatus further comprises a first pumping arrangement which is operationally connected to the transport chamber and which is conceived to evacuate the transport chamber.

It further comprises a second pumping arrangement which is operationally connected to the treatment compartment and which is conceived to evacuate the treatment compartment. Thereby, a pumping arrangement is connected to the pumping port of the pumping compartment and it is this pumping arrangement which is at least a predominant part of the pumping arrangement conceived to evacuate the transport chamber and which is exclusively the pumping arrangement which is conceived to evacuate the treatment compartment.

Figure 2:
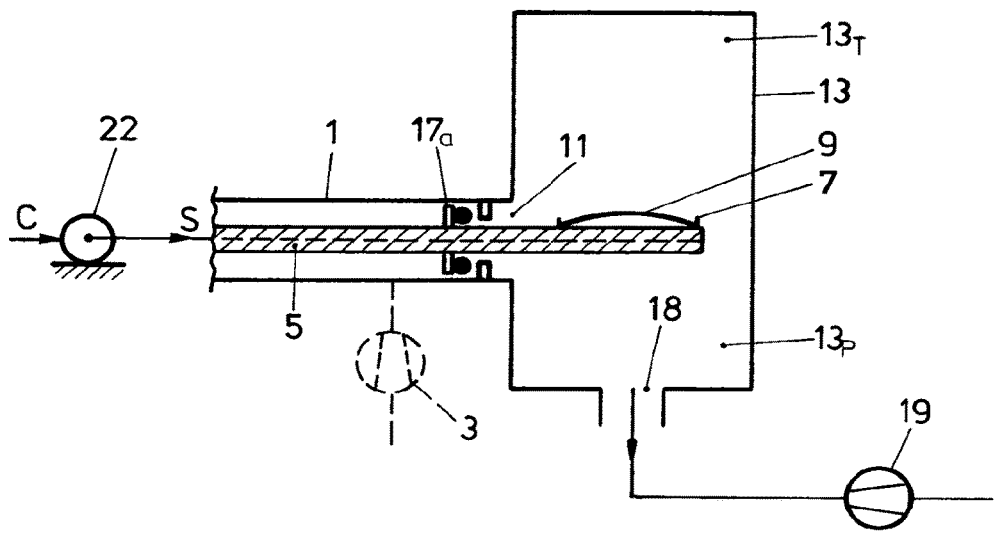
Figure 3:
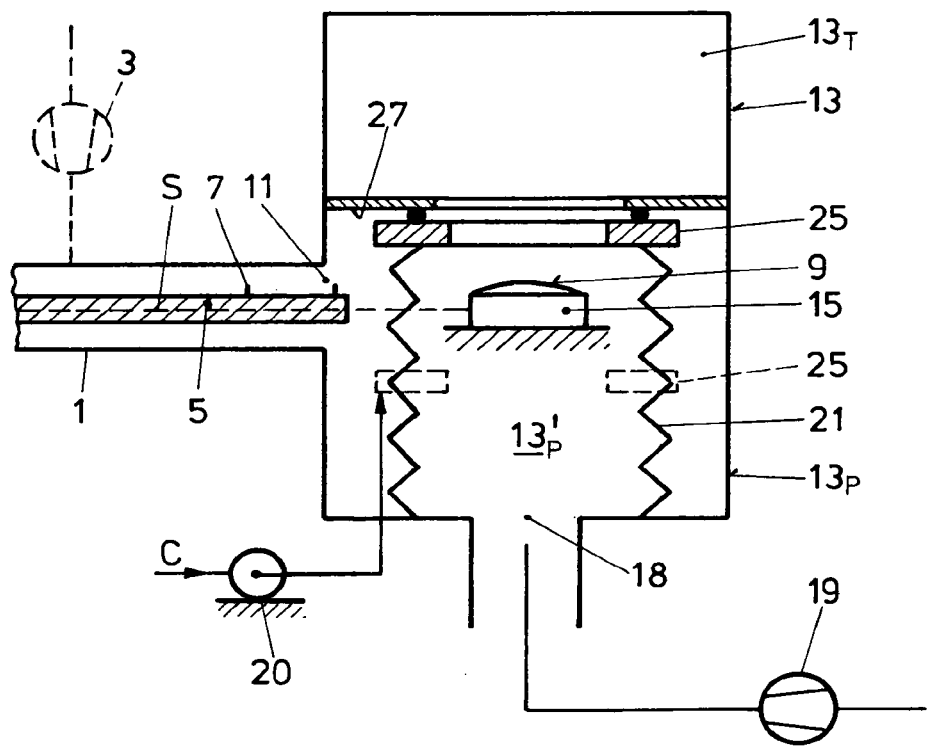
Figure 4:
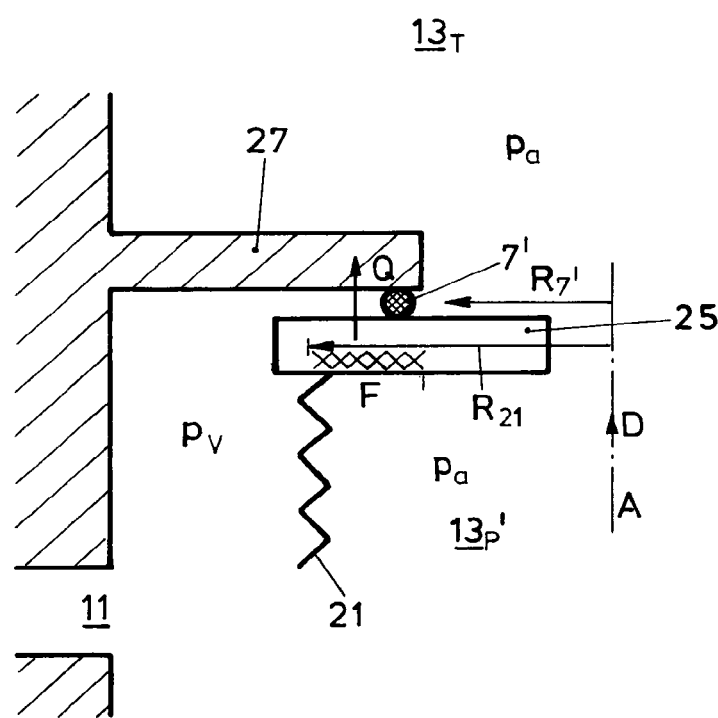
Figure 5:
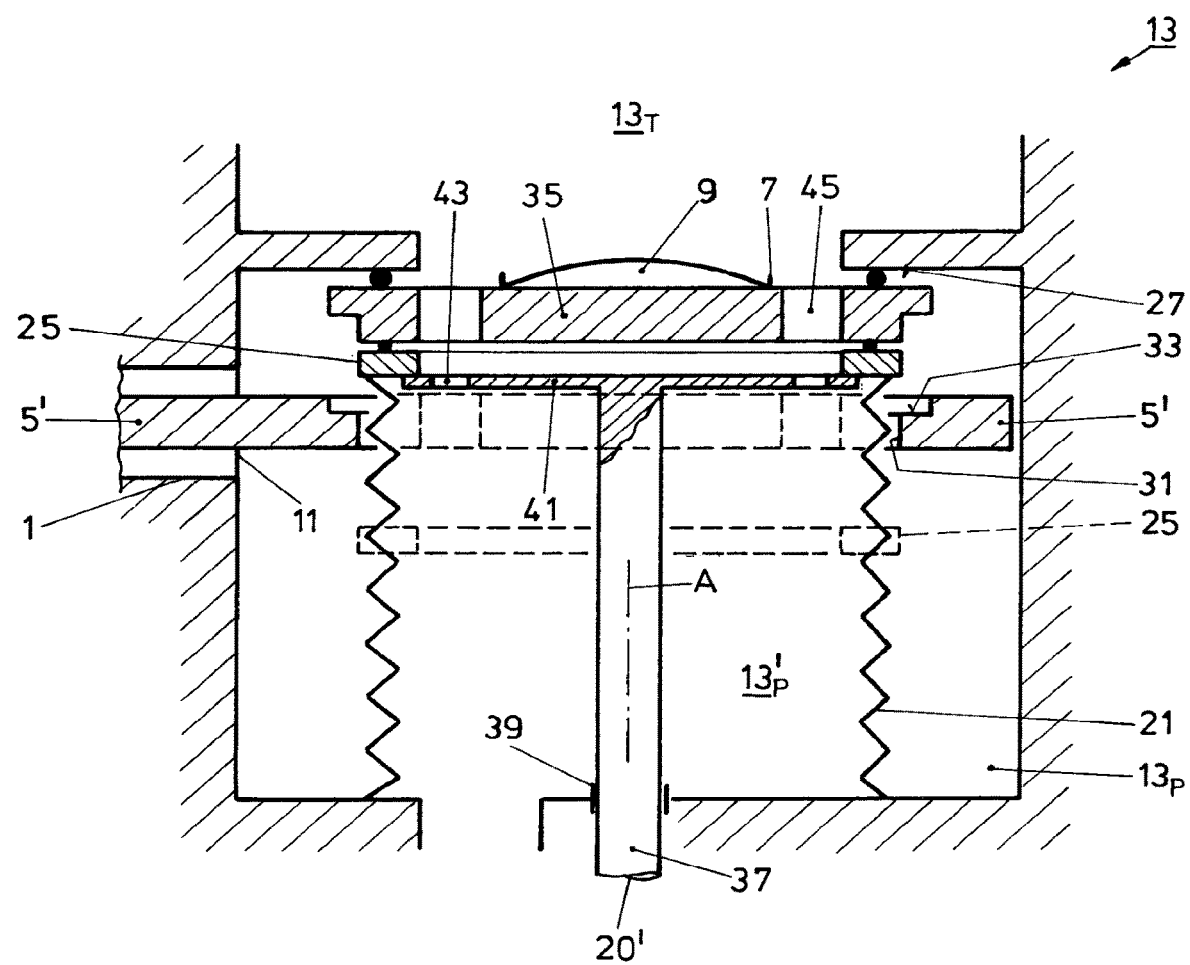
Figure 6:
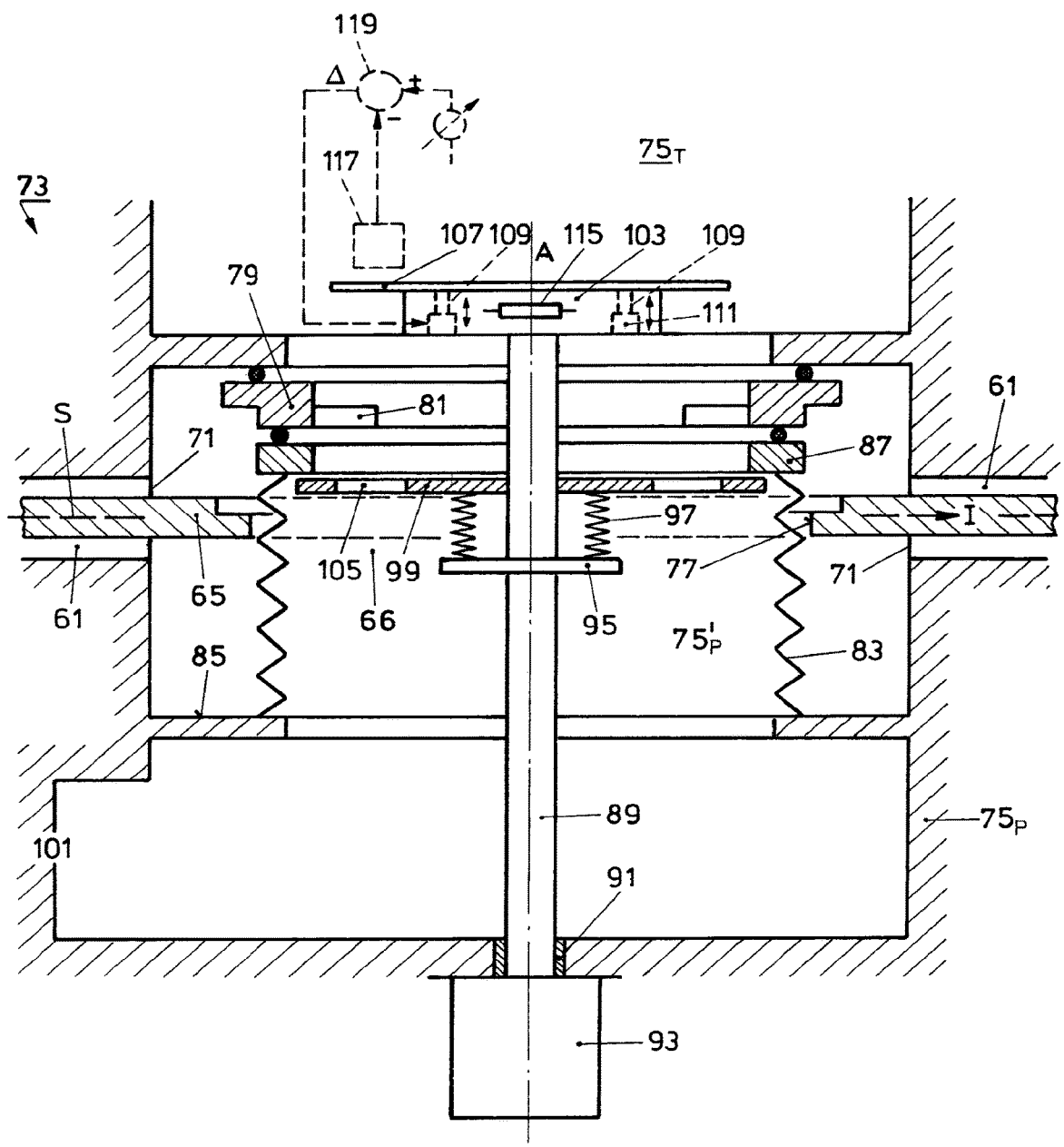
Figure 7:
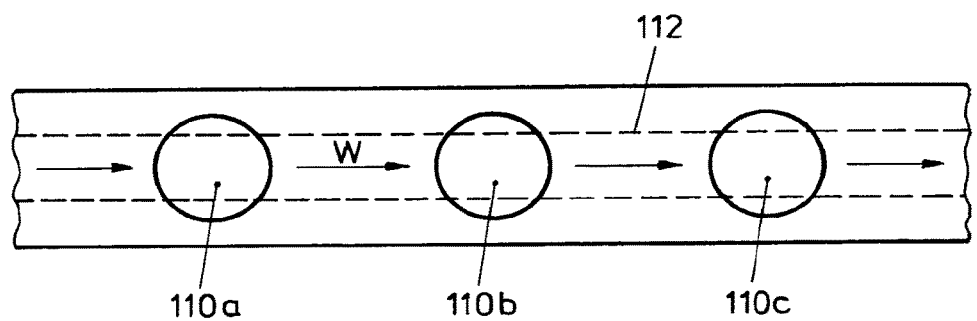
Figure 8:
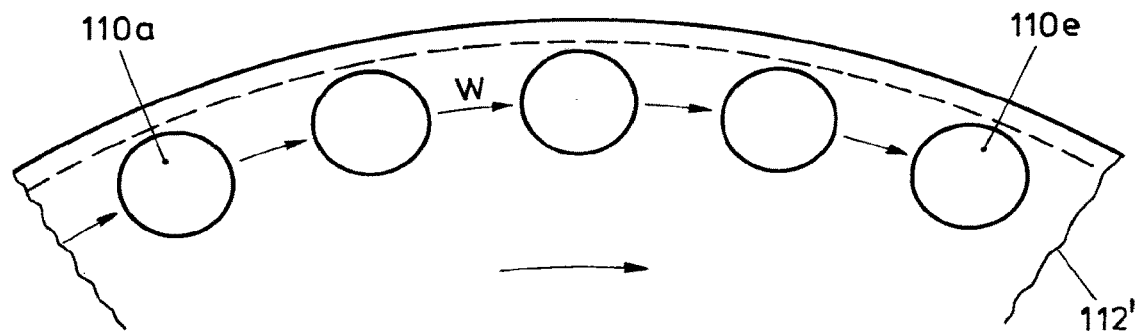
Figure 9:
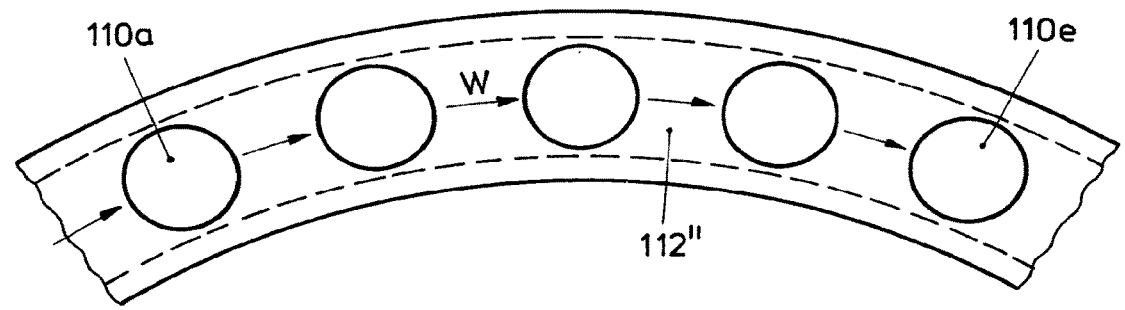

The present invention shall now be further exemplified with the help of figures. They show:

FIG. 1 schematically and simplified, a first embodiment of the apparatus according to the present invention, whereat a transport arrangement is removed from the vacuum treatment chamber during treating a workpiece;

FIG. 2 in a representation in analogy to that of FIG. 1, a second embodiment of the invention, whereat the transport arrangement remains in the vacuum treatment chamber during vacuum treatment of the workpiece;

FIG. 3 still in a schematic representation, a further embodiment of the invention in analogy to that of FIG. 1;

FIG. 4 a part of an embodiment of the apparatus according to the invention and according to FIG. 3, whereat high-pressure in a treatment compartment as provided by the apparatus according to the invention strengthens a seal;

FIG. 5 in a more detailed, still schematic representation, a further embodiment of the apparatus according to the invention, combining facilities of the embodiment of FIGS. 2 and 3;

FIG. 6 in a representation in analogy to that of FIG. 5, a further today realized embodiment of the present invention;

FIG. 7 most schematically, a part of an apparatus according to the invention with a linear transport arrangement;

FIG. 8 in a representation according to that of FIG. 7, the apparatus according to the invention with a circular centrally driven transport arrangement, and FIG. 9 still in a representation in analogy to those of FIGS. 7 and 8, an apparatus according to the invention with a ring-shaped circular transport arrangement.

By means of FIGS. 1 and 2 the generic concept according to the present invention shall be described. Within a transport chamber 1 which is evacuatable as e.g. with a transport chamber pump arrangement 3 a transport arrangement 5 is controllably drivable along a moving path shown in dash line, S. The transport arrangement 5 has at least one workpiece support 7 for a workpiece 9 to be treated. The transport chamber 1 communicates via an opening 11 with a vacuum treatment chamber 13. The vacuum treatment chamber 13 comprises on one hand a workpiece treatment compartment $13_T$ on one side of the movement path S of the transport arrangement 5 and, opposite to the treatment compartment $13_T$ with respect to the movement path S, a pumping compartment $13_P$. According to FIG. 1 there is provided along the movement path S of the transport arrangement 5 in the vacuum treatment chamber 13 a workpiece receiving member 15 upon which the workpiece 9 is deposited by the transport arrangement 5 as shown in dash line. After deposition of the workpiece 9 in the vacuum treatment chamber 13 and according to the embodiment of FIG. 1 the transport arrangement 5 is retracted e.g. in a position as shown in FIG. 1 out of vacuum treatment chamber 13.

After deposition of the workpiece 9 on support 15 a sealing arrangement 17, which as schematically shown in FIG. 1 is controllably driven as by a drive 20, to move across opening 11 and to seal off opening 11. The sealing arrangement 17 in sealing position is shown in dash line.

Thereby, the vacuum treatment chamber 13 including both mutually freely communicating compartments $13_T$ and $13_P$ are sealingly separated from transport chamber 1. The workpiece 9 on support 15 is exposed to a vacuum treatment in treatment compartment $13_T$. Accordingly (not shown in FIG. 1) the treatment compartment $13_T$ is equipped with units to perform a desired workpiece treatment e.g. with sputtering sources, arc evaporators, gas supplies, plasma discharge units as for PECVD treatment, heaters, coolers, etc.

In the pumping compartment $13_P$ there is provided a large pumping port 18 to apply a pumping arrangement 19. The pumping compartment $13_P$ provides for a large surface area allowing to apply such large pumping port 18 with very large cross-section for the pumping arrangement 19 so that the overall vacuum treatment chamber 13 including the treatment compartment $13_T$ may rapidly be pumped down to vacuum pressure as desired. Thereby, the pumping effect of pumping arrangement 19 may be tailored so large that whenever the opening 11 is free from sealing arrangement 17 this pumping arrangement 19 may also be exploited to provide at least predominant pumping effect upon the transport chamber 1. In such case the transport chamber pumping arrangement 3 becomes only an auxiliary arrangement, if at all necessary. If the transport arrangement serves more than one of the vacuum treatment chambers 13, the respective pumping arrangements 19 commonly also act as transport chamber pumping arrangement.

Reference No. 22 schematically shows the controllable drive for the transport arrangement 5.

Whereas in FIG. 1 an embodiment is schematically shown in which the transport arrangement 5 is retracted from the vacuum treatment chamber 13 before treatment is performed therein and thus before the sealing arrangement 17 sealingly closes opening 11, FIG. 2 shown in an analogous representation an embodiment in which the transport arrangement 5 remains with the workpiece 9 resting thereon within the vacuum treatment chamber 13 during workpiece treatment.

According to the embodiment of FIG. 2 the sealing arrangement 17a is conceived between the transport arrangement 5 and the border of opening 11 so that the opening 11 is shut off whenever the transport arrangement 5 is completely introduced into the vacuum treatment chamber 13 and remains there for the treatment of workpiece 9.

Departing from the general approach of the present invention according to FIG. 1, FIG. 3 shows in a representation in analogy to that of the FIGS. 1 and 2 one embodiment to realize the apparatus of FIG. 1. In the pumping compartment $13_P$ there is sealingly mounted a tubular bellow 21. The tubular bellow 21 is drivingly and controllably extractable towards the treatment compartment $13_T$ and accordingly retractable into the pumping compartment $13_P$. The pumping port 18 for pumping arrangement 19 is provided in the wall of the pumping compartment $13_P$ inside the tubular bellow 21. Thus in fact, inside pumping compartment $13_P$ a pumping area $13_P'$ is established inside bellow 21. The open end of bellow 21 towards the treatment compartment $13_T$ is controllably driven, as schematically shown by drive 20, movable in a position sealingly closing off opening 11 with respect to the pumping area $13_P'$ and the treatment compartment $13_T$, which both are kept in open communication when the opening 11 is sealingly closed. According to FIG. 3 this is realized by providing at that end of bellow 21 pointing towards the treatment compartment $13_T$ a sealing ring or frame 25 which sealingly engages a shoulder surface 27 of the vacuum treatment chamber 13. With respect to opening 11 and movement path S the ring- or frame-shaped shoulder surface 27 is located towards the treatment compartment $13_T$.

It is often necessary e.g. for workpiece exchange, for maintenance purposes or, for exchanging a treatment facility to open the treatment compartment $13_T$ and thereby to expose the overall vacuum treatment chamber 13 to ambient pressure. Thereby, it should be prevented on one hand that the remaining of the treatment apparatus with the transport chamber 1 and possibly additional treatment facilities served by the transport arrangement 5 become contaminated or will have to be re-evacuated. Often it might also be desired to continue workpiece treatment by the apparatus although one of the multiple treatment facilities being under maintenance, more generically being open to ambient pressure. Therefore, in one embodiment as exemplified schematically in FIG. 4, as an example for the embodiment of FIG. 3, the sealing arrangement is conceived so that a pressure difference existing between the vacuum treatment chamber 13 at a higher pressure and the transport chamber 1 at lower pressure relative to the pressure in the treatment chamber, provides for an increased sealing force upon sealing of the opening 11.

This is generically realized by providing surfaces at the movable sealing arrangement which are exposed to the pressure difference from pressure in treatment compartment $13_T$ and pumping compartment $13_P$ and pressure in the transport chamber 1, so that the resulting force points towards the sealing engagement. Departing from the embodiment of FIG. 3 FIG. 4 shows such an embodiment. After having established the seal with respect to ring or frame shoulder surface 27 the surface of sealing ring 25 in the bellow 21 is exposed along surface area F shown crosshatched in FIG. 4 to the pressure $p_a$ in the treatment compartment $13_T$ and pumping area $13_P'$ while the opposite surface of sealing ring 25 is exposed to the lower pressure Pv of the transport chamber 1. Creating such a pressure difference along a surface area as of F and over sealing ring 25 leads to a resulting force Q as shown in FIG. 4 on the sealing ring 25 which points in seal-closing direction. This is realized in that with respect to the axis A of the tubular bellow 21, the seal 7' at sealing ring 25 to shoulder 27 in FIG. 4 is established along a ring area with a radius $R_7$, which is smaller than the radius $R_{21}$ to the ring area whereat the sealing ring 25 is sealingly linked to the end of tubular bellow 21.

In the embodiment as schematically shown in FIG. 5 the approaches according to FIG. 2 and of FIG. 3 are combined, i.e. FIG. 5 shows an embodiment wherein the transport arrangement 5 remains in the vacuum treatment chamber 13 when the workpiece 9 is treated by action from the treatment compartment $13_T$ and the opening 11 to the transport chamber 1 is sealingly closed making use of a tubular bellow 21.

The transport arrangement 5' has a through-opening 31. The through-opening 31 is e.g. circular.

The border of the through-opening 31 defines for a support shoulder 33 or more generally a retaining arrangement. A workpiece carrier plate 35 rests within through-opening 31 upon support shoulder 33.

Thus, workpiece carrier plate 35 may be freely lifted from the transport arrangement 5' towards the treatment compartment $13_T$. The position of the workpiece carrier plate 35 as resting in the through-opening 31 of transport arrangement 5' is shown in dash line.

The upper end of tubular bellow 21 is sealingly joint to sealing ring 25. The drive 20 as schematically shown in FIG. 3 to lift and retract bellow 21 is realized in the embodiment according to FIG. 5 by a lifting arrangement 20' controllably driven (not shown in FIG. 5). A lifting rod 37 coaxially to the axis A of the tubular bellow 21 is guided in a vacuum-tight lead-through 39 through the wall of the pumping compartment $13_P$ and carries at its end pointing towards the treatment compartment $13_T$ a lifting plate 41.

The lifting plate 41 is tailored so as to engage the sealing ring or frame 25 at the end of bellow 21, thereby lifting sealing ring 25 in sealing engagement with workpiece carrier plate 35 and thereby lifting this plate 35 in sealing engagement with shoulder ring surface 27. The lifting plate 41 has a multitude of or a few large through-openings 43 along its periphery. The workpiece carrier plate 35 as well has a multitude of or a few large through-openings 45 along its periphery. The workpiece support 7 for workpiece 9 is provided primarily by the surface towards treatment compartment $13_T$ in the central area of the workpiece carrier plate 35.

FIG. 6 shows in a representation analogous to that of FIG. 5 a further embodiment of the present invention which is realized today. The generic differences with respect to the embodiment of FIG. 5 are that the embodiment according to FIG. 6 comprises a transport arrangement and a respectively construed transport chamber which passes through the vacuum treatment chamber and is thus perfectly suited to be realized in the frame of a vacuum treatment apparatus, whereat substrates are transported from one vacuum treatment facility to the other in a one-directional indexed manner. Additionally, the embodiment according to FIG. 6 allows positioning the workpiece within the treatment compartment independently of establishing a seal between the treatment compartment/pumping compartment on one hand and the transport chamber on the other hand.

FIG. 6 shows the apparatus in workpiece treatment position.

According to the embodiment of FIG. 6 a transport chamber 61 communicates by two opposed openings 71 with the vacuum treatment chamber 73. A transport arrangement 65, which is shaped as a circular disk plate, a ring plate or a linear extending band-shaped plate, resides in transport chamber 61 and runs through the vacuum treatment chamber 73. The transport arrangement 65 is controllably drivingly moved by a respective drive (not shown in FIG. 6) either in one direction or forth and back in an indexed manner and then transports in each index cycle a workpiece support area 66 centralized into vacuum treatment chamber 73. The vacuum treatment chamber 73 comprises on one side of movement path S of the transport arrangement 65 a treatment compartment $75_T$ and with respect to the addressed movement path S opposite to the treatment compartment $75_T$ a pumping compartment $75_P$. The transport arrangement 65 comprises in the workpiece support area 66, in analogy to the embodiment of FIG. 5, a through-opening 77 wherein a sealing ring 79 resides similarly to workpiece carrier plate 35 in the respective through-opening in transport arrangement 5' of FIG. 5. The sealing ring 79 comprises support members 81 which radially project into the ring 79. Further, in analogy to the embodiment of FIG. 5, there is provided a tubular bellow 83. One end of the tubular bellow 83 is sealingly linked to a ring shoulder surface 85 of the pumping compartment $75_P$. The opposed end of tubular bellow 83 is sealingly linked to a second sealing ring 87. A lifting arrangement provided coaxially to the tubular bellow 83 about axis A comprises a lifting rod 89 which passes by a vacuum-tight lead-through 91 through the wall of pumping compartment $75_P$ and is controllably movable up and down by drive 93.

Lifting rod 89 is provided with a flange 95 as an actuator. Flange 95 is rigidly mounted to lifting rod 89. The flange 95 supports towards the treatment compartment $75_T$ an arrangement of springs 97, which supports a lifting plate 99 which is movable along the lifting rod 89 and resides and is supported on and by the spring arrangement 97 with respect to flange 95.

There is further provided a large pumping port 101 communicating with the interior of the tubular bellow 83 which thus in analogy to the embodiment of FIG. 5 forms a pumping area $75_P'$.

The lifting plate 99 comprises wide through-openings 105.

The end of the lifting rod 89 towards the treatment compartment $75_T$ is equipped with a workpiece-lifting plate 103 which may be provided with e.g. a passive chuck or an active chuck as with an electrostatic chuck for holding workpiece 107, e.g. a disk-shaped workpiece as e.g. a wafer.

Alternatively or additionally, the workpiece 107 may be held upon lifting plate 103 as commonly known in the art by a weight-ring (not shown) residing on the periphery of workpiece 107.

The embodiment according to FIG. 6 operates as follows:

When the lifting plate 103 is completely retracted towards the pumping compartment $75_P$ the transport arrangement 65 is freely movable through the vacuum treatment chamber 73. The pumping arrangement (not shown in FIG. 6) connected to large pumping port 101 pumps vacuum treatment chamber 73 as well as transport chamber 61. The transport arrangement 65 is then moved e.g. as shown by the arrow I in an indexed manner so as to locate the workpiece support area 66 centralized into the vacuum treatment chamber 73. The workpiece 107, as e.g. a wafer, resides in sealing ring 79, held by support members 81, and sealing ring 79 resides in through-opening 77 supported along the border of through-opening 77 on the transport arrangement 65. Lifting plate 103 being completely retracted below the movement path S of the transport arrangement 65 and thus below transport arrangement 65, the tubular bellow 83 with second sealing ring 87, flange 95 with spring arrangement 97, supported lifting plate 99 are all retracted below the transport arrangement 65. The high-capacity vacuum pump connected to pumping port 101 e.g. continuously running, the lifting rod 89 is lifted by drive 93. By the lifting movement of flange 95 and yet substantially unbiased spring arrangement 97 the lifting plate 99 is lifted and engages second sealing ring 87 sealingly joint to the upper end of tubular bellow 83.

The lifting plate 103 lifts workpiece 107 out of its support by support members 81 at sealing ring 79. The second sealing ring 87 is lifted by the lifting plate 99 towards sealing ring 79', thereby the sealing ring 79 is lifted upwards up to sealingly resting against ring-shaped shoulder surface 109 at the treatment compartment $75_T$. Thereby the second sealing ring 87 sealingly engages the sealing ring 79 and the seal between ring shoulder surface 109, sealing ring 79 and second sealing ring 87 is established by the biasing force of lifting plate 99 against the force of spring arrangement 97. In spite of the fact that the sealing ring 79 with support member 81 for the workpiece 107 already sealingly resides against ring shoulder 109, the lifting rod 89 is further driven upwards against the biasing force of spring arrangement 97 and lifts the workpiece 107 in that position within treatment compartment $75_T$ where it will be treated by the installed vacuum process. This position is shown in FIG. 6.

Summarizing, whenever the workpiece 107 with lifting plate 103 has been moved in treatment position, there is established a seal between second sealing ring 87 and sealing ring 79, between sealing ring 79 and ring shoulder surface 109. The tubular bellow 83 separates the pumping area $75_P'$ from that area of the vacuum treatment chamber 73 wherein the transport chamber 61 communicates via openings 71. Free flow communication between the treatment compartment $75_T$ and pumping port 101 is established via wide open through-opening of sealing ring 79, wide open second sealing ring 87, large through-openings 105 in lifting plate 99 and large inner space left open by ring shoulder surface 85.

Once the workpiece 107 has been treated as desired, the lifting rod 89 is retracted whereby the addressed seals are opened and workpiece 107 together with sealing ring 79 are placed back upon the transport arrangement 65, which then may be further indexed as all the members operationally coupled to the lifting rod 89 are retracted back into the pumping compartment $75_T$ and thus do not encumber movement of the transport arrangement 65.

Due to the fact that, according to the present invention, there is provided a separate compartment aside of a treatment compartment, wherein a workpiece is vacuum treated, and further in flow communication with the addressed treatment compartment and a switched flow communication from the treatment compartment to a transport chamber with a transport arrangement for delivering at least one workpiece into and removing such at least one workpiece once treated, there is ample space available for providing a pumping port of very large cross-section also for the treatment compartment. Thereby very fast pumping down of the treatment compartment onto a desired low vacuum becomes possible.

With an eye on FIG. 4 it has to be noted that also in the embodiments of FIG. 5 or 6 it is advantageously realized that whenever the treatment compartment is opened to ambient, e.g. for maintenance purposes, the ambient pressure increases the sealing forces on the seals separating the treatment compartment from the transport chamber. Still with an eye on FIG. 4 the surface considerations which have been explained in context with that fig. are also valid for the embodiment of FIG. 5 or 6 e.g. with respect to second sealing ring 87 and bellow 83 in analogy to realization of sealing ring 25 and bellow 21 of FIG. 4.

As was already addressed, the apparatus according to the present invention, as of FIG. 6, is perfectly suited for an indexed transport of a multitude of workpieces along several vacuum treatment stations at which the workpieces have consecutively to be treated.

As exemplified in context with FIG. 6 lifting pins 109 (shown in dash line) may be provided, which are synchronously liftable and retractable by respective drives 111 with respect to the surface of the lifting plate 103 whereupon the workpiece 107 resides. Thereby the workpiece may be controllably and accurately lifted from the addressed surface also during treatment of the workpieces. If e.g. the lifting plate 103 is equipped with a heating and/or cooling facility 115, the exchange of heat between the lifting plate and the workpiece may be adjusted by controlled adjustment of the distance between the workpiece bottom surface and the lifting plate top surface.

By providing a temperature sensing device 117 for the workpiece temperature, the output of which being compared with a rated, desired temperature value at a comparator unit 119, the output of which, according to the comparison result, acting on the drives 111 a negative feedback control is for the workpiece temperature is established, exploiting the lifting pin arrangement as an adjusting member. Clearly such pin arrangement and possibly such control loop may be provided in any embodiment of the invention where the workpiece resides on a support during treatment.

FIG. 7 most schematically shows such an apparatus according to the invention, where at least one of a multitude of vacuum treatment chambers is realized according to the present invention and all vacuum treatment chambers are served by a common transport arrangement in a linearly indexed manner as shown by the arrows W. If all vacuum processes to be performed by such vacuum treatment stations 110a . . . 110c necessitate separate pumping on respective processing vacua, then all such stations are realized as has been exemplified by the embodiments as especially of FIG. 6. If on the other hand one or the other process does not need separate pumping, then the respective vacuum treatment chamber may be realized conventionally without pumping port. Whereas according to FIG. 7 the transport arrangement schematically shown in dash line at 112 is indexed in a linear movement, FIG. 8 shows in an analogous representation an overall apparatus, wherein indexed transport is realized by a circular plate-type transport arrangement 112'. In a similar representation FIG. 9 shows still another embodiment of an overall apparatus according to the present invention, wherein indexed workpiece transport is realized by means of a ring-shaped transport arrangement 112".

| Reference list | |
|---|---|
| 1 | transport chamber |
| 3 | transport chamber pump arrangement |
| 5 | transport arrangement |
| 7 | workpiece support |
| 9 | workpiece |
| 11 | opening |
| 13 | vacuum treatment chamber |
| $13_T$ | workpiece treatment compartment |
| $13_P$ | pumping compartment |
| 15 | support |
| 17 | sealing arrangement |
| 18 | pumping port |
| 19 | pumping arrangement |
| 20 | drive |
| 20' | drive for seal |
| 21 | tubular bellow |
| 22 | drive for the transport arrangement 5 |
| 25 | sealing ring or frame |
| 27 | shoulder surface |
| 31 | through-opening |
| 33 | shoulder |
| 35 | workpiece carrier plate |
| 37 | lifting rod |
| 39 | lead through |
| 41 | lifting plate |
| 61 | transport chamber |
| 65 | transport arrangement |
| 66 | workpiece support area |
| 71 | opposed pump |
| 73 | vacuum treatment chamber |
| $75_T$ | treatment compartment |

-continued

| Reference list | |
|---|---|
| $75_P$ | pumping compartment |
| 77 | through opening in 65 |
| 79 | sealing ring |
| 81 | support member |
| 83 | tubular bellow |
| 85 | ring shoulder surface |
| 87 | second sealing ring |
| 89 | lifting rod |
| 91 | vacuum-tight lead through |
| 93 | drive |
| 95 | flange |
| 97 | spring arrangement |
| 99 | lifting plate |
| 101 | pumping port |
| $75_P'$ | pumping area |
| 103 | lifting plate |
| 107 | workpiece |
| 109 | Pin |
| 111 | Drive |
| 115 | Heating and/or cooling facility |
| 117 | Temperature sensing device |
| 119 | Comparator unit |

The invention claimed is:

1. A vacuum treatment apparatus comprising:
a vacuum treatment chamber (13, 73) to perform a desired workpiece treatment of a workpiece and with a rigid wall;
a vacuum transport chamber (1, 61);
a handling opening common to said vacuum treatment chamber and to said vacuum transport chamber;
a workpiece transport (5, 65) for handling a workpiece from said vacuum transport chamber through said handling opening and into said vacuum treatment chamber, said transport being drivingly movable along a movement path (S) extending from said vacuum transport chamber through said handling opening and in said vacuum treatment chamber;
a workpiece support adapted to support a workpiece in said treatment chamber, said vacuum treatment chamber (13, 73) comprising a workpiece treatment compartment (13T, 75T) for a workpiece to which a surface of a workpiece to be treated on said workpiece support is exposed for treatment, said vacuum treatment compartment being located on one side of said movement path (S) in said vacuum treatment chamber and being equipped with units to perform the workpiece treatment and a pumping compartment (13P, 75P) opposite said workpiece treatment compartment (13T, 75T) with respect to said movement path (S) in said vacuum treatment chamber;
a pumping port arrangement for said workpiece treatment compartment, said pumping port arrangement consisting of at least one pumping port in said pumping compartment;
a controllable seal (17, 17a, 109, 79, 87, 83, 85) within said treatment chamber and controllably sealing off or freeing a first gas flow communication between said vacuum transport chamber (1, 61) and said pumping port (18, 101) through said handling opening and being constructed so as to separate a pumping area from an area of said vacuum treatment chamber with which said pumping port is in a second gas flow communication when said first gas flow communication is sealed off.

2. The apparatus of claim 1, wherein said controllable seal is conceived to increase sealing force as a pressure in said treatment compartment and in an area of said pumping compartment in flow communication with said pumping port increases.

3. The apparatus of claim 1, wherein said controllable seal is conceived to seal off said opening as said workpiece transport is in a position at which said workpiece support on said workpiece transport is within said vacuum treatment chamber.

4. The apparatus of claim 1, wherein said controllable seal comprises a drivingly extendable and retractable tubular bellow, one end thereof being sealingly mounted in said pumping compartment, another end thereof being controllably movable about said opening to seal off said opening, said pumping port being located in an area of said pumping compartment which is in flow communication with an inside of said bellow.

5. The apparatus of claim 4, said transport chamber extending across said vacuum treatment chamber and communicating with a second handling opening opposite said one handling opening, said other end of said bellow being sealingly movable about said second handling opening as well.

6. The apparatus of claim 5, said workpiece transport being movable along said movement path through said vacuum treatment chamber and through said first and a second handling opening and comprising a multitude of spaced apart of said workpiece supports.

7. The apparatus of claim 4, said workpiece support being adapted to support a workpiece on said workpiece transport and in said treatment chamber, said workpiece transport comprising a through opening, said workpiece support being held in said through opening and liftable in a direction towards said treatment compartment, said other end of said tubular bellow being drivingly movable in sealing contact with said workpiece support so as to lift it into sealing contact with an annular area along the wall of said treatment chamber.

8. The apparatus of claim 7 comprising a lift arrangement controllably liftable from said pumping compartment towards said treatment compartment and located inside said tubular bellow and comprising an actuator to liftably cooperate with said other end of said tubular bellow so as to lift it into said sealing contact with said workpiece support.

9. The apparatus of claim 7, said other end of said tubular bellow being sealingly mounted to a ringplate, said actuator comprising a support plate with through openings.

10. The apparatus of claim 8, said workpiece support comprising a frame comprising holding members adapted for a holding workpiece within an open area of said frame, said holding members being adapted to allow lifting of a workpiece from said frame in the direction towards said treatment compartment, said actuator cooperating via a spring arrangement with said other end of said tubular bellow, said lift arrangement comprising a plate located at the end of said lift arrangement towards said treatment compartment.

11. The apparatus of claim 7, said workpiece transport being movable along said transport path through said vacuum treatment chamber and through first and second of said handling openings and comprising a multitude of spaced apart of said workpiece support.

12. The apparatus of claim 11, said transport being movable along a linear or circular moving path.

13. The apparatus of claim 12, said workpiece transport being movable along the circular moving path, said treatment compartment and said pumping compartment being arranged opposite each other in direction of an axis of said circular moving path.

14. The apparatus of claim 1, further comprising, a pumping arrangement connected to said pumping port and being operationally connectable to a pumping port of said vacuum transport chamber.

15. The apparatus of claim 1 comprising a controllably drivable lifting arrangement in said treatment chamber adapted for lifting a workpiece from said workpiece support or for lifting said workpiece together with said workpiece support.

16. The apparatus of claim 15 comprising a temperature sensor adapted to sense a temperature of a workpiece on said workpiece support, said temperature sensor and said controllably drivable lifting arrangement being operatively connected in a negative feedback loop for the temperature of a workpiece on said workpiece support.

17. The apparatus of claim 1 said workpiece support being adapted to support a workpiece on said workpiece transport and in said treatment chamber, said workpiece support being applicable to said workpiece transport.

* * * * *